United States Patent
Kurimoto

(10) Patent No.: US 10,804,249 B2
(45) Date of Patent: Oct. 13, 2020

(54) LIGHT-EMITTING DEVICE WITH LIGHT-REFLECTIVE AND LIGHT-ABSORBING PIECES LAYERED ON A SURFACE

(71) Applicant: NICHIA CORPORATION, Anan-shi, Tokushima (JP)

(72) Inventor: Takeo Kurimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 158 days.

(21) Appl. No.: 16/114,472

(22) Filed: Aug. 28, 2018

(65) Prior Publication Data

US 2019/0067256 A1 Feb. 28, 2019

(30) Foreign Application Priority Data

Aug. 29, 2017 (JP) ................ 2017-164222

(51) Int. Cl.
| | |
|---|---|
| H01L 25/07 | (2006.01) |
| H01L 25/075 | (2006.01) |
| H01L 33/62 | (2010.01) |
| H01L 33/10 | (2010.01) |
| H01L 33/36 | (2010.01) |
| H01L 33/44 | (2010.01) |
| H01L 33/46 | (2010.01) |
| H01L 33/56 | (2010.01) |
| H01L 33/60 | (2010.01) |
| H01L 33/48 | (2010.01) |

(52) U.S. Cl.
CPC .......... *H01L 25/0753* (2013.01); *H01L 33/10* (2013.01); *H01L 33/36* (2013.01); *H01L 33/44* (2013.01); *H01L 33/46* (2013.01); *H01L 33/62* (2013.01); *H01L 33/486* (2013.01); *H01L 33/56* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 2002/0068373 A1* | 6/2002 | Lo ................ | H01L 33/0062 438/33 |
| 2003/0062534 A1 | 4/2003 | Hata et al. | |

(Continued)

FOREIGN PATENT DOCUMENTS

| | | |
|---|---|---|
| JP | H09-298313 A | 11/1997 |
| JP | 2000-012895 A | 1/2000 |

(Continued)

*Primary Examiner* — Lex H Malsawma
(74) *Attorney, Agent, or Firm* — Squire Patton Boggs (US) LLP

(57) ABSTRACT

A light-emitting device includes: a light-emitting element that includes a light-transmissive substrate having a first surface and a second surface opposite to the first surface, a semiconductor layer on the first surface, and positive and negative electrodes on the semiconductor layer; a mounting board that includes wiring and a base supporting the wiring; one or more light-reflective pieces; and one or more light-absorbing pieces. The light-emitting element is flip-chip mounted on or above the wiring. The light-reflective layer and the light-absorbing layer cover part of the second surface and are layered in this order from the second surface.

19 Claims, 7 Drawing Sheets

(56) References Cited

U.S. PATENT DOCUMENTS

| | | | | |
|---|---|---|---|---|
| 2005/0056831 A1* | 3/2005 | Senda | .................... | H01L 33/22 |
| | | | | 257/40 |
| 2005/0156189 A1* | 7/2005 | Deguchi | ................. | H01L 33/38 |
| | | | | 257/103 |
| 2009/0008673 A1* | 1/2009 | Kato | .................... | C08G 77/04 |
| | | | | 257/100 |
| 2011/0254039 A1* | 10/2011 | Kim | ....................... | H01L 33/46 |
| | | | | 257/98 |
| 2012/0061706 A1* | 3/2012 | Kamada | ................. | H01L 24/32 |
| | | | | 257/98 |
| 2017/0179345 A1* | 6/2017 | Yamada | ................ | H01L 33/505 |

FOREIGN PATENT DOCUMENTS

| | | |
|---|---|---|
| JP | 2003-086843 A | 3/2003 |
| JP | 2010-263050 A | 11/2010 |
| JP | 2015-012203 A | 1/2015 |

\* cited by examiner

LIGHT-EMITTING DEVICE WITH LIGHT-REFLECTIVE AND LIGHT-ABSORBING PIECES LAYERED ON A SURFACE

CROSS-REFERENCE TO RELATED APPLICATION

This application claims priority to Japanese Patent Application No. 2017-164222, filed on Aug. 29, 2017, the disclosure of which is hereby incorporated by reference in its entirety.

BACKGROUND

The present disclosure relates to a light-emitting device.

It is known to use LED displays each including an array of red, green, and blue LED elements as pixels. Such LED displays offer light with higher luminance than the luminance of backlight-type liquid-crystal displays and are used for large-scale digital signage and other applications.

There is a demand for such LED displays to have high contrast ratios, but reflection of extraneous light may cause false lighting and reduce the contrast ratios in environments, such as the outdoors in the daytime, in which the effects of the extraneous light are strong. To improve the contrast ratios of light-emitting devices, for example, Japanese Unexamined Patent Application Publication No. 2015-12203 discloses a light-emitting device including an LED chip, a first light-absorbing layer on a surface on which the LED chip is mounted, and a second light-absorbing layer on the LED chip.

However, the light-absorbing layer is disposed on the entire upper surface of the LED chip in the above light-emitting device, therefore its light extraction efficiency may decrease.

Therefore, certain embodiments according to the present disclosure has an object to provide a light-emitting device that offers higher luminance and a higher contrast ratio.

SUMMARY

A light-emitting device according to certain embodiments of the present disclosure includes a light-emitting element that includes a light-transmissive substrate having a first surface and a second surface opposite to the first surface, a semiconductor layer on the first surface, and positive and negative electrodes on the semiconductor layer; a mounting board that includes wiring and a base supporting the wiring; one or more light-reflective pieces; and one or more light-absorbing pieces. The light-emitting element is flip-chip mounted on or above the wiring. The light-reflective layer and the light-absorbing layer cover part of the second surface and being layered in this order from the second surface.

A light-emitting device according to certain embodiments of the present disclosure includes: a plurality of light-emitting elements that each includes a light-transmissive substrate having, a first surface; and a second surface opposite to the first surface, a semiconductor layer on the first surface, and positive and negative electrodes on the semiconductor layer; a mounting board including wiring and a base supporting the wiring; one ore more light-reflective pieces; and one or more light-absorbing pieces. The light-emitting elements are flip-chip mounted on or above the wiring. The light-emitting elements include: a first light-emitting element emitting light with a first wavelength; a second light-emitting element emitting light with a second wavelength different from the first wavelength; and a third light-emitting element emitting light with a third wavelength different from the first wavelength and the second wavelength. The light-reflective pieces and the light-absorbing pieces cover part of at least one of the second surfaces and are layered in this order from the second surface.

The light-emitting devices according to certain embodiments achieve high contrast ratios.

DETAILED DESCRIPTION

Figure 1:
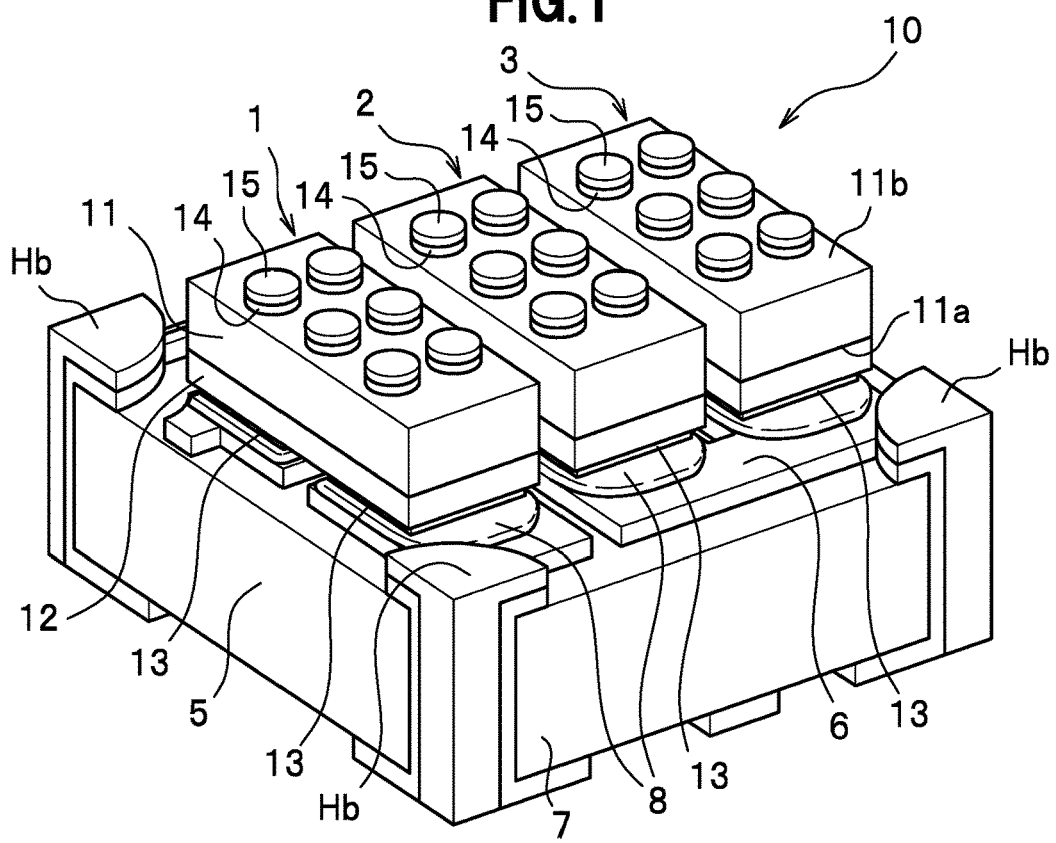
FIG. 1 is a schematic perspective view of a light-emitting device according to a first embodiment.

The following describes light-emitting devices according to embodiments. The drawings referred to in the descriptions below schematically illustrate the present embodiments. The scales, the distances, the positional relations, and the like of members may be exaggerated, or illustration of part of the members may be omitted. In the descriptions below, the same name or reference numeral generally represents the same member or those of similar type, and its detailed description will be omitted as appropriate.

First Embodiment

Structure of Light-Emitting Device

A light-emitting device 10 according to a first embodiment will be described referring to FIG. 1 to FIG. 4.

The light-emitting device 10 includes light-emitting elements 1 to 3 that each include a light-transmissive substrate 11 having a first surface and a second surface opposite to the first surface, a semiconductor layer 12 formed on the first surface, and positive and negative electrodes formed on the semiconductor layer 12, and the light-emitting device 10 includes a mounting board 5 that includes wiring 6 and a base 7 supporting the wiring 6. The light-emitting elements 1 to 3 are flip-chip mounted on or above the wiring 6. The light-emitting device 10 further includes one or more light-reflective pieces 14 and one or more light-absorbing pieces 15 that cover part of the second surface of the light-transmissive substrate 11, and are layered in this order from the second surface.

Figure 2:
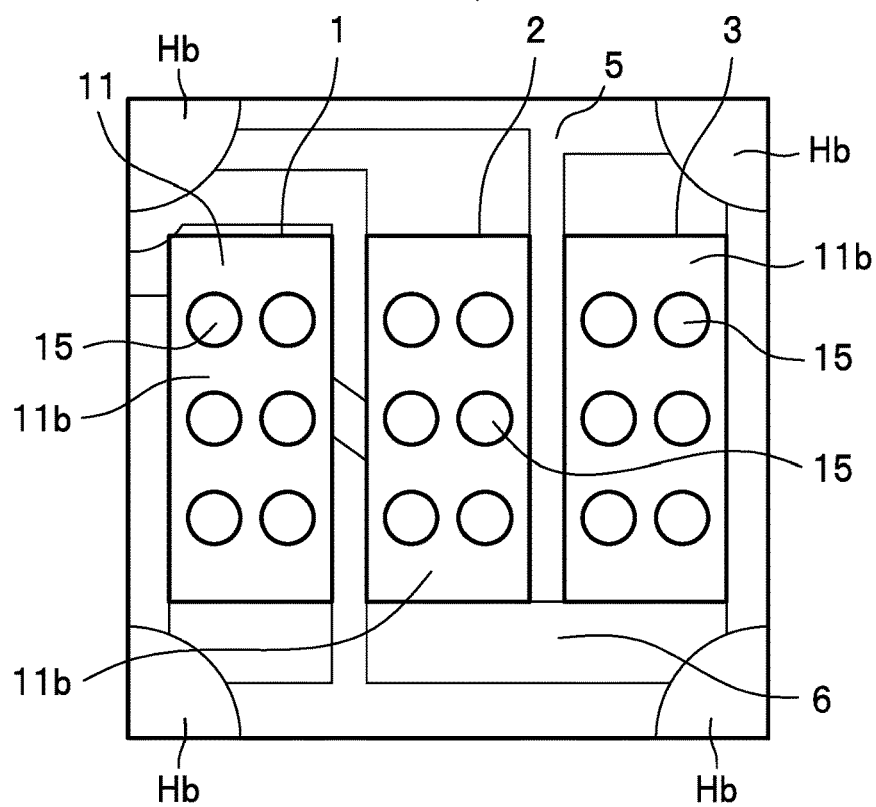
FIG. 2 is a schematic plan view of the light-emitting device according to the first embodiment.

As shown in FIG. 1 and FIG. 2, the light-emitting device 10 includes the first light-emitting element 1, the second light-emitting element 2, the third light-emitting element 3, and the mounting board 5. The mounting board 5 includes the wiring 6 and the base 7 supporting the wiring 6. The first to third light-emitting elements 1, 2, and 3 are each flip-chip mounted on or above the wiring 6 of the mounting board 5. Fan-shaped members in a plan view formed at the four corners of the light-emitting device 10 are filler members Hb to fill through-holes that have been formed at the time of manufacture of the mounting board 5.

The light-emitting device 10 according to the first embodiment constitutes a pixel of an LED display used for, for example, digital signage. The light-emitting device 10 includes the first light-emitting element 1 that emits light having a first wavelength, the second light-emitting element 2 that emits light having a second wavelength different from the first wavelength, and the third light-emitting element 3 that emits light having a third wavelength different from the first and second wavelengths. That is, the first light-emitting element 1 that emits red light (hereinafter also simply referred to as "R"), the second light-emitting element 2 that emits green light (hereinafter also simply referred to as "G"), and the third light-emitting element 3 that emits blue light (hereinafter also simply referred to as "B") are mounted on or above the mounting board of one light-emitting device 10. The light-emitting device 10 can emit light of R, G, and B independently or in combination.

Light-Emitting Elements

For example, light-emitting diodes (LEDs) can be used for the light-emitting elements used here. The mounting orientation of each light-emitting element is preferably parallel to its main emission direction.

The structures of the first to third light-emitting elements 1, 2, and 3 will be described more specifically. The structure of the first light-emitting element 1 is substantially the same as the structures of the second light-emitting element 2 and the third light-emitting element 3 as a whole except that the colors of light emitted are different due to difference of the compositions of the semiconductor layer. Hence, the structure of the first light-emitting element 1 will be described, and the description of the structures of the second light-emitting element 2 and the third light-emitting element 3 will be omitted to avoid repetition.

Figure 3:
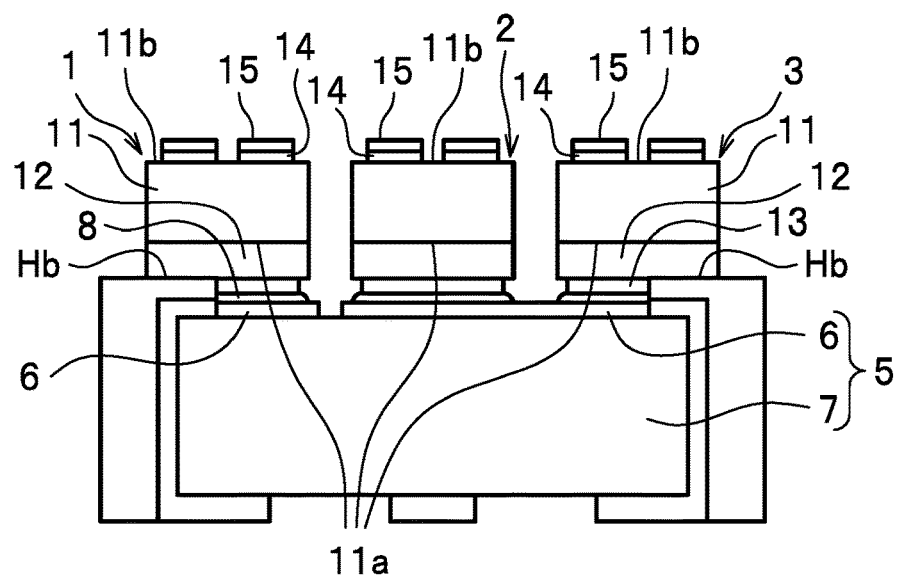
FIG. 3 is a schematic lateral view of the light-emitting device according to the first embodiment.
Figure 4:
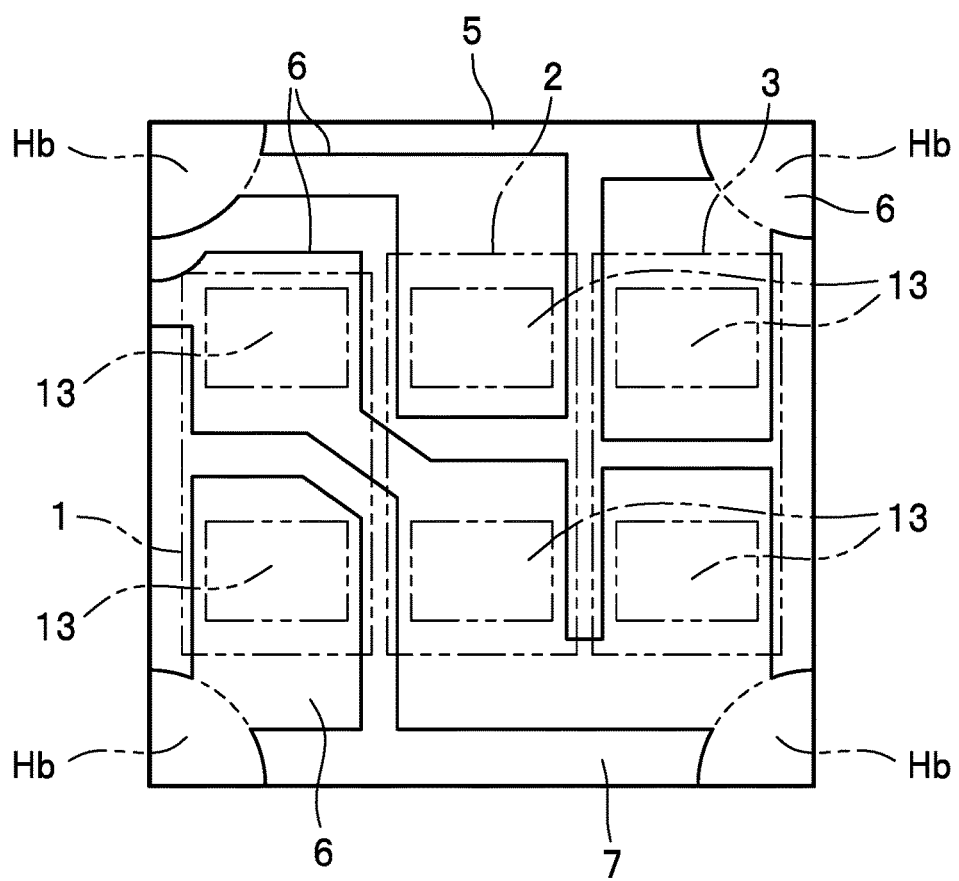
FIG. 4 is a schematic plan view of an illustrative wiring structure of a base of the light-emitting device according to the first embodiment.

As shown in FIG. 3 and FIG. 4, the first light-emitting element 1 includes the light-transmissive substrate 11 having the first surface and the second surface opposite to the first surface, the semiconductor layer 12 formed on the first surface of the light-transmissive substrate 11, and positive and negative electrodes 13 formed on the semiconductor layer 12. Part of the second surface of the light-transmissive substrate 11 is covered with the light-reflective pieces 14 and the light-absorbing layer described later. The second surface and the lateral surfaces between the first surface and the second surface of the light-transmissive substrate 11 are main emission surfaces of the first light-emitting element 1.

The first light-emitting element 1 preferably has a substantially rectangular shape, particularly a square or elongated rectangular shape, in a plan view. The first light-emitting element 1 may have another shape. A polygonal shape such as hexagonal shapes can further enhance the light-emission efficiency of the light-emitting element. The first light-emitting element 1 preferably includes at least two electrodes, which are a positive electrode and a negative electrode of the light-emitting element 1, disposed on the same surface. In the case where the light-emitting device 10 includes a plurality of light-emitting elements, the positive or negative electrodes of the light-emitting elements can be connected to a common terminal. One of a plurality of portions of the wiring 6 of the mounting board 5 serves as the common terminal. The light-emitting elements may be connected in series or in parallel.

The light-transmissive substrate 11 is provided with the semiconductor layer 12 on a first surface 11a, and a second surface 11b opposite to the first surface 11a is partially covered with the light-reflective pieces 14 and the light-absorbing layer described later. Specific examples of the light-transmissive substrate 11 include a sapphire, spinel ($MgAl_2O_4$), SiC, or NGO ($NdGaO_3$) substrate, a $LiAlO_2$ substrate, a $LiGaO_3$ substrate, and GaN substrate. The thickness of the light-transmissive substrate 11 is, for example, about 50 µm to 1000 µm, preferably about 80 µm to 500 µm, more preferably about 100 µm to 300 µm. The term "light-transmissive" means a property of transmitting at least 50%, preferably at least 70%, more preferably at least 80%, even more preferably at least 90%, of light emitted from the light-emitting element 1.

The semiconductor layer 12 is, for example, a layered body of semiconductor layers formed on the first surface 11a of the light-transmissive substrate 11. The semiconductor layer 12 includes at least a first semiconductor layer, a second semiconductor layer, and an active layer therebetween. The semiconductor layer 12 may include electrodes and/or an insulating film. The semiconductor layer 12 is formed on the first surface 11a, which is the main surface of the light-transmissive substrate 11. The positive and negative electrodes 13 are formed on the upper surface (i.e., the surface of the semiconductor layer 12 opposite to the light-transmissive substrate 11). In the case where the first light-emitting element 1, the second light-emitting element 2, and the third light-emitting element 3 respectively emit different colors of light, known materials are used for the semiconductor layer 12 of respective element.

The positive and negative electrodes 13 are formed on the semiconductor layer 12 on the light-transmissive substrate 11 in the first light-emitting element 1. The positive and negative electrodes 13 are, for example, a first electrode connected to the first semiconductor layer and a second electrode connected to the second semiconductor layer. A known metal that enables electrical connection can be used as the material for the electrodes 13. Specifically, for example, single-layer films or layered films formed using metals, such as Au, Pt, Pd, Rh, Ni, W, Mo, Cr, Ti, Al, and Cu, or alloys of these metals can be used. The positive and negative electrodes 13 are bonded to the mounting board 5 described later with bonding members 8.

Light-Absorbing Layer and Light-Reflective Layer

The light-emitting device 10 includes the light-reflective pieces 14 and the light-absorbing pieces 15 that cover part of the second surface of the light-transmissive substrate 11 and are layered in this order from the second surface. The part of the second surface is the main light-extracting surface of the light-emitting element.

The light-absorbing pieces 15 are disposed on or above the second surface 11b of the light-transmissive substrate 11 with the light-reflective pieces 14 disposed therebetween. The light-absorbing pieces 15 are members each having an optical absorption coefficient for visible light larger than the optical absorption coefficient of the light-reflective pieces 14. The light-absorbing pieces 15 are disposed in order to alleviate false lighting due to reflection of extraneous light. The light-reflective pieces 14 are disposed in order to alleviate decrease in the light extraction efficiency due to absorption of light emitted from the first light-emitting element 1 by the light-absorbing pieces 15. The light-absorbing pieces 15 and the light-reflective pieces 14 have, for example, circular shapes, and six light-absorbing pieces 15 and six light-reflective pieces 14 are disposed at regular intervals on or above the second surface 11b of the rectangular light-transmissive substrate 11.

The light-absorbing pieces 15 are formed using a material that can block or absorb light emitted from the light-emitting element and extraneous light such as sunlight. For example, a resin layer containing a colored filler, such as black pigments and carbon black, having a low light transmittance can be used. The area ratio of the light-absorbing pieces 15 to the second surface 11b is preferably 10% to 60% in consideration of effects of the color of the semiconductor layer 12. If the area ratio of the light-absorbing pieces 15 is too high, it becomes difficult to exit light to the outside. If the area ratio of the light-absorbing pieces 15 is too low, light from the outside tends to be reflected by the second surface, and it becomes difficult to visually recognize the difference from the state where the light-emitting element is lighting up. In other words, the light-emitting device 10 cannot achieve a high contrast ratio. Accordingly, the area ratio of the light-absorbing pieces 15 is desirably in the range of 10% to 60%, preferably 20% to 55%, more preferably 25% to 50%.

The light-reflective pieces 14 are formed using a material that can reflect light emitted from the light-emitting element. For example, a material that reflects 60% or more, furthermore, 70% or more, 80% or more, or 90% or more, of light emitted from the light-emitting element is preferable. Specifically, a resin layer containing a light-reflective substance or a metal layer of Al, Ag, or other metals can be used. The light-reflective pieces 14 here are formed into the same shape and size as the light-absorbing pieces 15.

The light-emitting device 10 includes the light-reflective pieces 14 and the light-absorbing pieces 15 on or above the second surface 11b, which is the main light-extracting surface of the first light-emitting element 1, of the light-transmissive substrate 11. With this structure, a high contrast ratio is provided by effectively utilizing light reflection offered by the light-reflective pieces 14 and by allowing the light-absorbing pieces 15 to absorb light from the outside. The light-absorbing pieces 15 preferably absorb 90% or more of visible light.

Bonding Members

The first light-emitting element 1, the second light-emitting element 2, and the third light-emitting element 3 each having the above structures are flip-chip bonded to the wiring 6 of the mounting board 5, for example, with the bonding members 8.

The bonding members 8 connect the first and second electrodes, which serve as the positive and negative electrodes 13 of each of the first light-emitting element 1, the second light-emitting element 2, and the third light-emitting element 3, to the wiring 6 of the mounting board 5 such that the electrodes are away from each other. The bonding members 8 may be disposed on the wiring 6 of the mounting board 5 or the electrodes 13 of the light-emitting elements, or on both of these. Examples of the bonding members 8 include bumps of gold, silver, or copper; metal pastes each containing a resin binder and powder of a metal such as silver, gold, copper, platinum, aluminum, and palladium; tin-bismuth, tin-copper, tin-silver, and gold-tin solders; and brazing filler metals such as low-melting-point metals.

Mounting Board

The mounting board 5 includes at least the wiring 6 and the base 7 supporting the wiring 6. The mounting board 5 may further include an insulating protective film such as a solder mask and a coverlay. The thickness of the mounting board 5 as a whole, including the wiring 6, is, for example, in the range of 0.02 mm to 1 mm, preferably in the range of 0.05 mm to 0.5 mm in view of the strength of the mounting board 5 and the thickness of the light-emitting device.

The wiring 6 is formed at least on the upper surface (i.e., the surface on which the light-emitting elements are mounted) of the base 7 and may also be formed inside the base 7 and/or on a lateral surface and/or the lower surface of the base 7. The wiring 6 preferably includes element-connecting terminal portions to which the electrodes 13 of the light-emitting elements are connected, external-connecting terminal portions connected to an external circuit, and relay wiring portions connecting these terminal portions. The wiring 6 can be made of, for example, copper, iron, nickel, tungsten, chromium, aluminum, platinum, silver, gold, titanium, palladium, rhodium, or an alloy of these metals. The wiring 6 is configured with a single layer or a plurality of layers formed using these metals or alloys of these metals. In particular, copper or a copper alloy is preferable in view of heat dissipation performance. The outermost layer of the wiring 6 may be a layer made of a material such as silver, platinum, aluminum, rhodium, gold, and alloys of these metals in view of wettability with the bonding members and/or light reflectivity, and the like.

In the case of a rigid base, the base 7 can be formed using a resin or fiber-reinforced resin, a ceramic, glass, metal, paper, or the like. Examples of the resin or fiber-reinforced resin include epoxy resins, glass epoxy resins, bismaleimide-triazine (BT) resins, and polyimides. Examples of the ceramic include aluminum oxide, aluminum nitride, zirconium oxide, zirconium nitride, titanium oxide, titanium nitride, and mixtures of these materials. Examples of the metal include copper, iron, nickel, chromium, aluminum, silver, gold, titanium, and alloys of these metals. In the case of a flexible base, the base 7 can be formed using a polyimide, polyethylene terephthalate, polyethylene naphthalate, a liquid crystal polymer, a cycloolefin polymer, or the like. Among these base materials, use of a base material having physical properties such as a linear expansion coefficient similar to the linear expansion coefficient of the light-emitting element is particularly preferable.

In this structure of the light-emitting device 10, the light-absorbing pieces 15 reduce reflection of light from the outside, and the light-emitting device that offers a high contrast ratio between the period during which light is emitted and the period during which light is not emitted is provided.

In addition, suitable directional characteristics can be obtained by appropriately changing the shape of the light-absorbing pieces 15.

Further effects of the light-emitting device 10 according to the first embodiment will be described in further detail. The relation between the relative luminous intensity and the directivity angle of each of R, G, and B light of the light-emitting device 10 according to the first embodiment will be described referring to FIG. 5A and FIG. 5B.

Figure 5A:
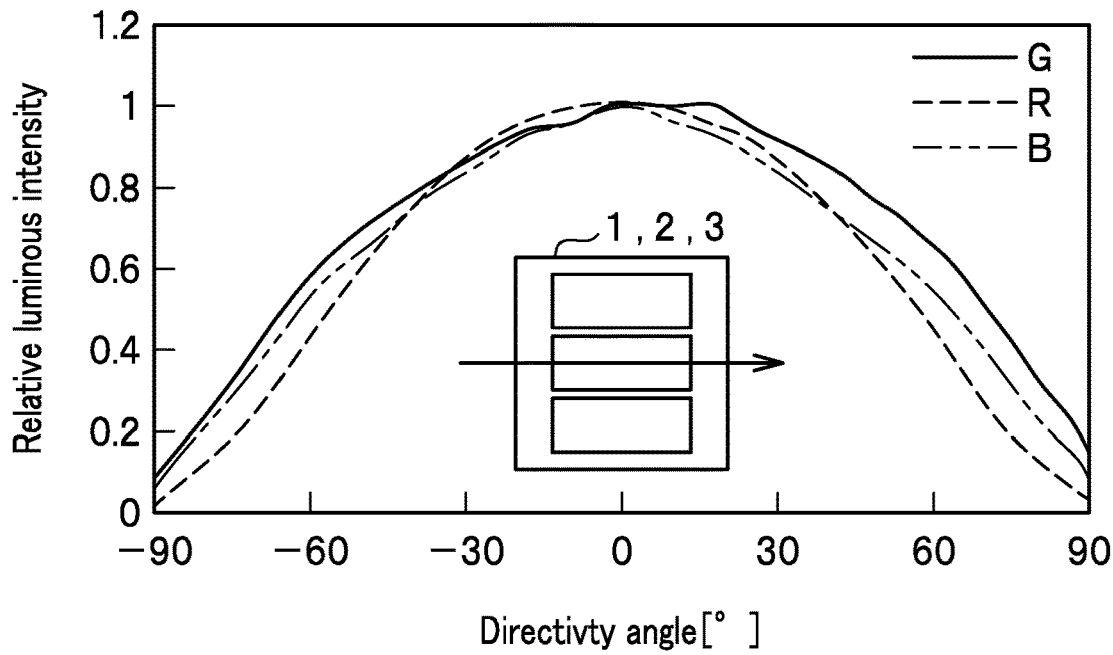
FIG. 5A is a graph showing the relation between the relative luminous intensity and the directivity angle of the light-emitting device according to the first embodiment.
Figure 5B:
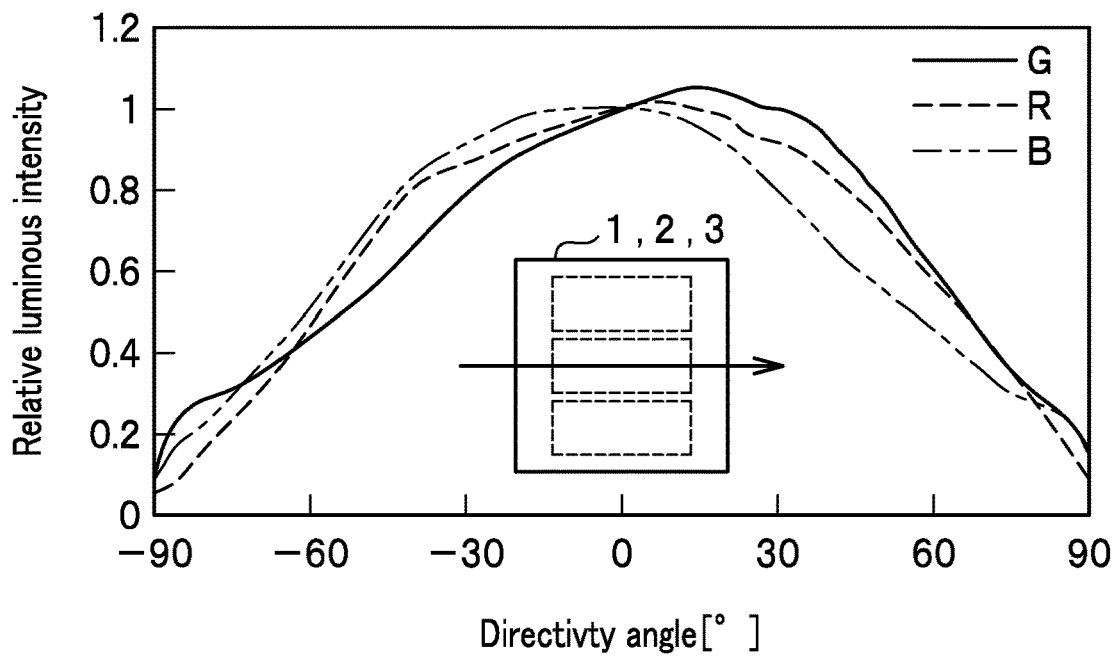
FIG. 5B is a graph showing the relation between the relative luminous intensity and the directivity angle of a light-emitting device employing face-up elements for comparison with the first embodiment.

In a light-emitting device including face-up mounted light-emitting elements, electrodes of the light-emitting elements and electrically-conductive wires connecting the electrodes to the land pattern of a mounting board are disposed on or above the light-extracting surface. Hence, as shown in FIG. 5B, fitting of directional characteristics of R, G, and B light is difficult for the light-emitting device, in which the light-emitting elements are face-up mounted. In other words, the peaks of relative luminous intensities of the first light-emitting element 1, the second light-emitting element 2, and the third light-emitting element 3 differ from one another, resulting in difficulty in fitting. On the other hand, the light-emitting device 10 according to the first embodiment in which the light-emitting elements are flip-chip mounted (first to third light-emitting elements 1, 2, and 3), do not suffer from this difficulty. Accordingly, as shown in FIG. 5A, fitting of the directional characteristics of R, G, and B light in the light-emitting device 10 according to the first embodiment can be improved compared with the graph shown in FIG. 5B. The directivity angle of the light-emitting device 10 corresponds to the direction indicated by the arrow shown in FIG. 5A or FIG. 5B.

Figure 6A:
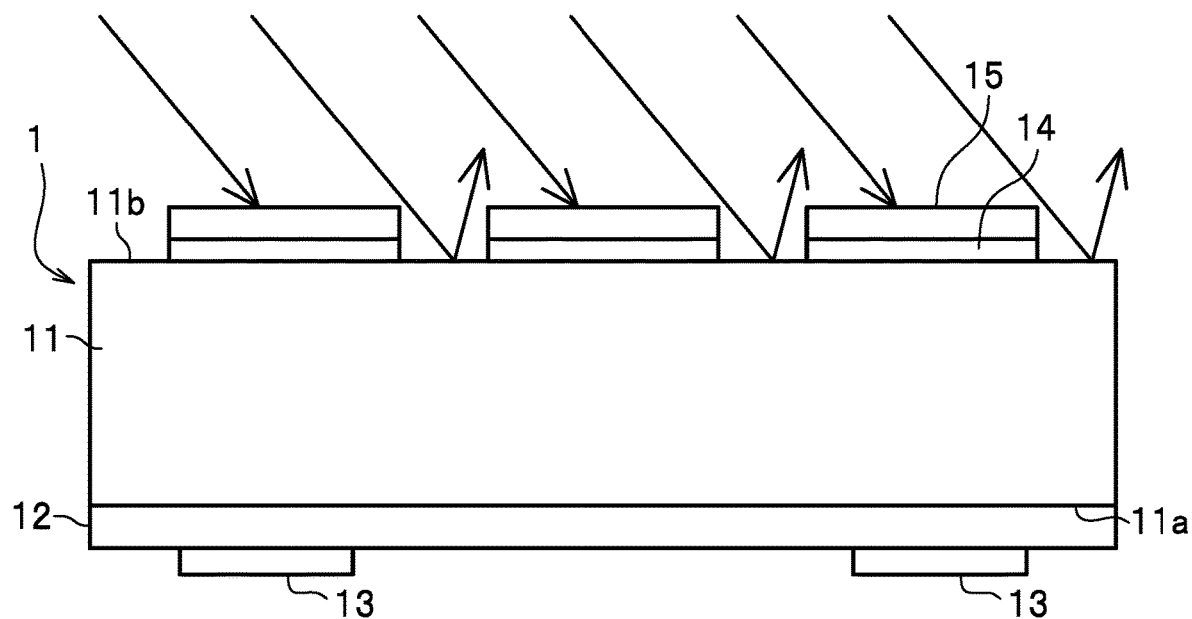
FIG. 6A is a schematic lateral view of the light-emitting device, according to the first embodiment, exposed to extraneous light.

If a light-emitting element including a light-transmissive substrate is flip-chip mounted in a light-emitting device, the upper surface (i.e., the second surface) of the light-transmissive substrate reflects extraneous light, and the phenomenon known as false lighting tends to occur in which the light-emitting element looks as if it is emitting light even when it is not emitting light. The contrast ratio when the light-emitting device is used for an LED display therefore decreases. On the other hand, in the light-emitting device 10 according to the first embodiment, the light-absorbing pieces 15 disposed on or above the light-extracting surface absorb part of extraneous light as shown in FIG. 6A, thereby alleviating false lighting due to reflection of the extraneous light and improving the contrast ratio.

Figure 6B:
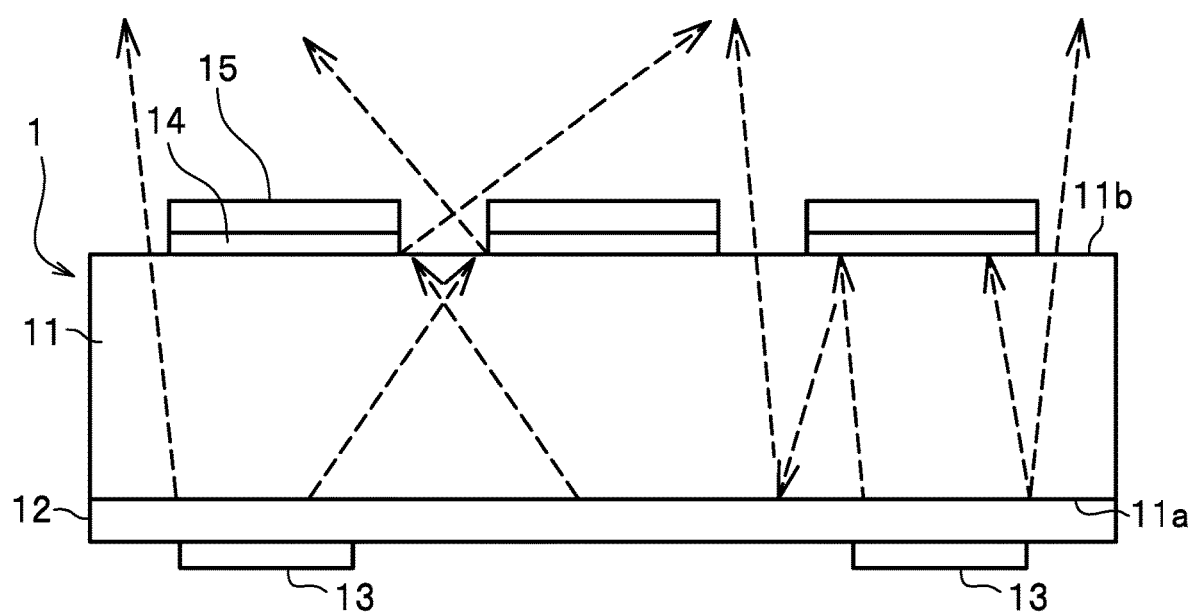
FIG. 6B is a schematic diagram illustratively showing part of light emitted from the light-emitting device according to the first embodiment.

In addition, the light-emitting device 10 according to the first embodiment includes the light-reflective pieces 14 between the light-transmissive substrate 11 and the light-absorbing pieces 15. Light emitted from the semiconductor layer 12 is not absorbed by the light-absorbing pieces 15 but is reflected by the light-reflective pieces 14, further reflected by the lower surface of the light-transmissive substrate 11 or the like, and consequently emitted through the upper main surface (i.e., light-extracting surface) and the lateral surfaces of the light-transmissive substrate 11, as shown in FIG. 6B. This structure can ensure the light extraction efficiency.

Second Embodiment

The light-emitting device may have such a structure that the light-reflective pieces 14 and the light-absorbing pieces 15 have, for example, shapes shown in FIG. 7A to FIG. 7D when viewed perpendicularly to the second surface 11b of the light-transmissive substrate 11, and the shapes and numbers of the pieces can be appropriately selected.

Figure 7A:
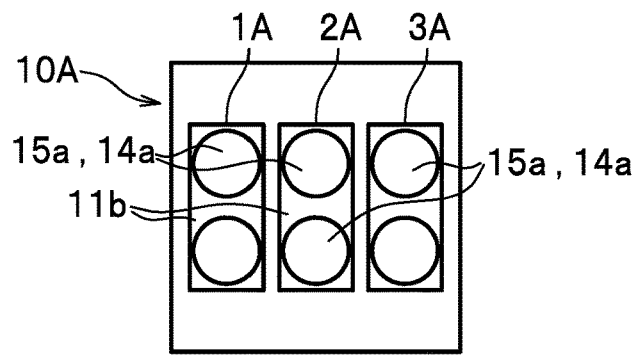
FIG. 7A is a schematic plan view of a planar shape pattern of a light-absorbing layer and a light-reflective layer of a light-emitting device according to a second embodiment.
Figure 7B:
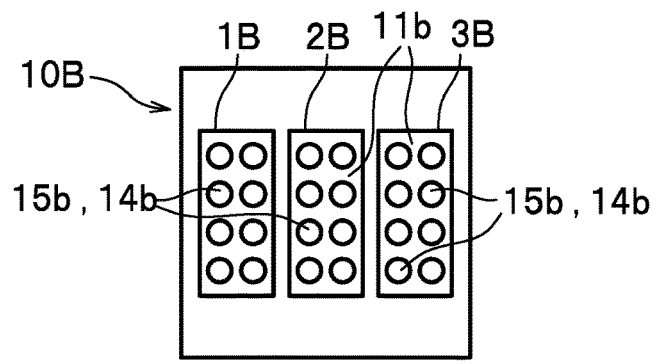
FIG. 7B is a schematic plan view of a planar shape pattern of a light-absorbing layer and a light-reflective layer of a light-emitting device according to the second embodiment.

As long as the area ratio is in the range of 10% to 60%, the pieces may be formed into circular shapes, and two the light-absorbing pieces 15a and two light-reflective pieces 14a, or eight light-absorbing pieces 15b and eight light-reflective pieces 14b, may be disposed on or above the second surface 11b of each of first light-emitting elements 1A and 1B, second light-emitting elements 2A and 2B, and third light-emitting elements 3A and 3B as shown in FIG. 7A and FIG. 7B. The area ratio in the structure shown in FIG. 1, the area ratio in the structure shown in FIG. 7A, and the area ratio in the structure shown in FIG. 7B may be the same or different as long as the area ratios are in the range of 10% to 60%.

Figure 7C:
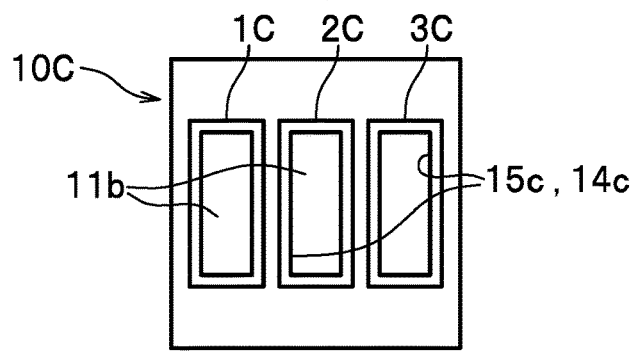
FIG. 7C is a schematic plan view of a planar shape pattern of a light-absorbing layer and a light-reflective layer of a light-emitting device according to the second embodiment.

The light-absorbing pieces 15c and the light-reflective pieces 14c on a first light-emitting element 1C, a second light-emitting element 2C, and a third light-emitting element 3C may each be formed into a frame shape as shown in FIG. 7C as long as the area ratio to each second surface 11b is in the range of 10% to 60%.

Figure 7D:
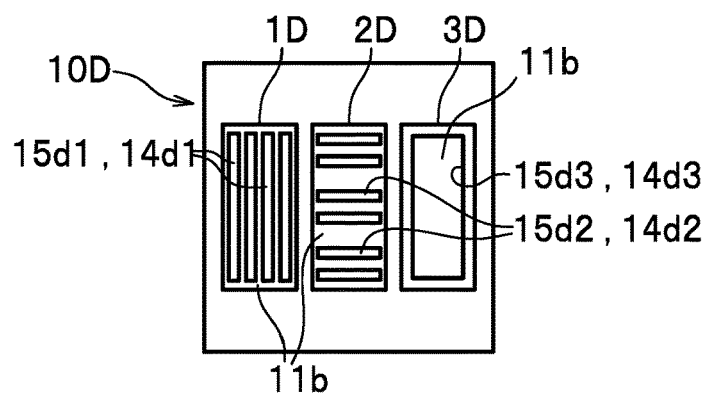
FIG. 7D is a schematic plan view of a planar shape pattern of a light-absorbing layer and a light-reflective layer of a light-emitting device according to the second embodiment.

Furthermore, the light-reflective pieces 14d1 to 14d3 and the light-absorbing pieces 15d1 to 15d3 on a first light-emitting element 1D, a second light-emitting element 2D, and a third light-emitting element 3D may each be formed into different planar shapes as shown in FIG. 7D as long as the area ratio to each second surface 11b is in the range of 10% to 60%.

In the present case, the first light-emitting element 1D is provided with the striped light-absorbing pieces 15d1 and the striped light-reflective pieces 14d1. Also, the second light-emitting element 2D is provided with the striped light-absorbing pieces 15d2 and the striped light-reflective pieces 14d2 both extending in a direction different from the direction of the pieces on the first light-emitting element 1D. In addition, the third light-emitting element 3D is provided with the frame-shaped light-absorbing piece 15d3 and the frame-shaped light-reflective piece 14d3. In the case where the shapes of the light-absorbing pieces 15d1 to 15d4 and the light-reflective pieces 14d1 to 14d3 are different, the area ratios to the respective second surfaces 11b may be the same or different. For example, a high area ratio may be employed for blue light, which is light with short wavelengths, and low area ratios may be employed for green light with longer wavelengths and red light with even longer wavelengths.

As described above, the light-emitting devices 10A to 10D having the structures shown in FIG. 7A to FIG. 7D also offer good contrast ratios and good directional characteristics.

Third Embodiment

Figure 7E:
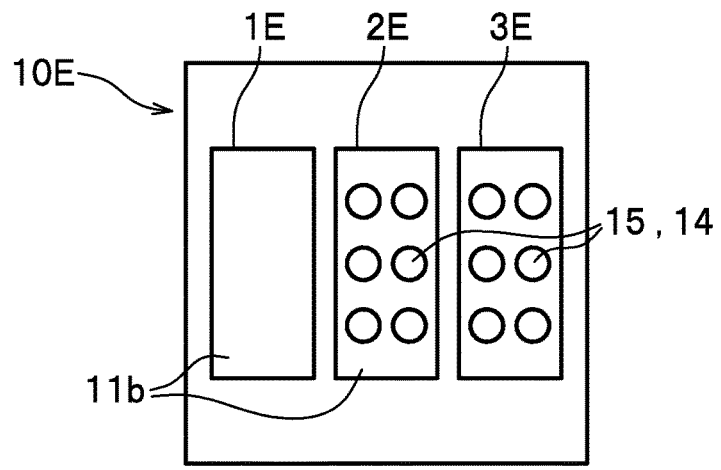
FIG. 7E is a schematic plan view of a planar shape pattern of a light-absorbing layer and a light-reflective layer of a light-emitting device according to a third embodiment.
Figure 7F:
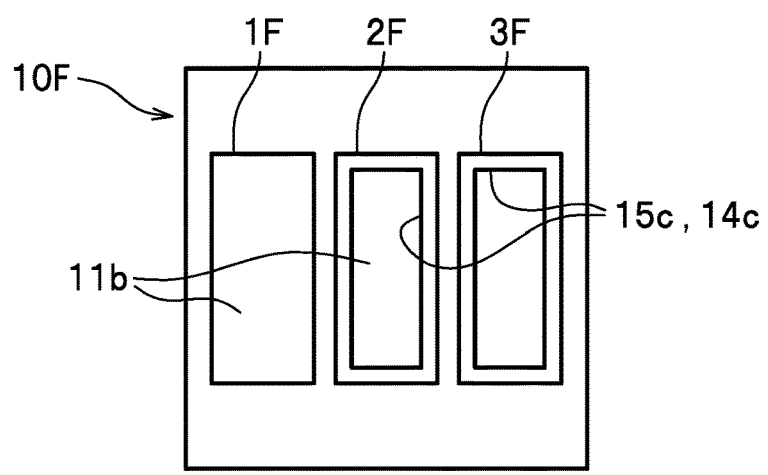
FIG. 7F is a schematic plan view of a planar shape pattern of a light-absorbing layer and a light-reflective layer of a light-emitting device according to the third embodiment.
Figure 7G:
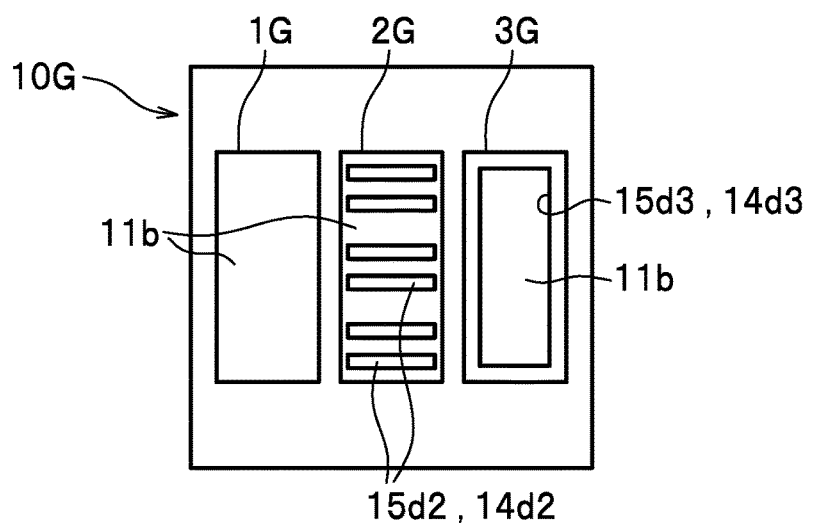
FIG. 7G is a schematic plan view of a planar shape pattern of a light-absorbing layer and a light-reflective layer of a light-emitting device according to the third embodiment.

It is also possible to constitute light-emitting devices 10E to 10G shown in FIG. 7E to FIG. 7G in each of which the light-reflective layer and the light-absorbing layer are not disposed on or above the first light-emitting element 1 but disposed on or above the second light-emitting element 2 and the third light-emitting element 3. The reason is that a first light-emitting element 1E emits red light and that the semiconductor layer 12 is made of a material that readily absorbs light. Hence, a good contrast ratio is obtained if the light-absorbing pieces and the light-reflective pieces are disposed on or above the second light-emitting element 2 and the third light-emitting element 3 even if the light-reflective pieces 14 and the light-absorbing pieces 15 are not disposed on or above the first light-emitting element 1.

Here, examples of the material for the first light-emitting element 1 that emits red light (light with wavelengths of 620 nm to 750 nm) include semiconductors such as GaAlAs and AlInGaP. The first light-emitting element 1 looks blackish because of the material. Hence, the semiconductor layer 12 of the first light-emitting element 1 can function as the light-absorbing pieces that absorbs extraneous light.

In addition, the ratio of the planar shape pattern of the light-reflective pieces 14 and the light-absorbing pieces 15 to the light-extracting surface of the first light-emitting element 1 may be lower than those of the ratios for the second light-emitting element 2 and the third light-emitting element 3.

MODIFICATION

Regarding the light-emitting devices 10 according to certain embodiments, the light-absorbing pieces 15 and the light-reflective pieces 14 have been described as having the same size, but the structure is not limited thereto. For example, the light-absorbing pieces 15 may be larger than the light-reflective pieces 14. Also in this case, the light-emitting device 10 is less likely to be appear whitish, and the contrast ratio is improved. On the other hand, part of light emitted from the semiconductor layer 12 is not reflected off the light-reflective pieces 14 but is absorbed by the light-absorbing pieces 15, making the area of the light-reflective pieces 14 sufficiently close to the area of the light-absorbing pieces 15 can alleviate decrease in the amount of light extracted. The same relation between the light-absorbing pieces and the light-reflective pieces may apply to the light-emitting devices 10A to 10G.

Examples of blue light-emitting element (emitting light with wavelengths of 430 nm to 490 nm) and green light-emitting element (emitting light with wavelengths of 490 nm to 570 nm) include elements including semiconductor layers made of semiconductor materials such as ZnSe, nitride semiconductors ($In_xAl_yGa_{1-x-y}N$ ($0 \leq x$, $0 \leq y$, $x+y \leq 1$)), and GaP.

R, G, and B light emitted from the light-emitting elements may be achieved using phosphor layers containing phosphors that serve as wavelength conversion members.

Figure 8:
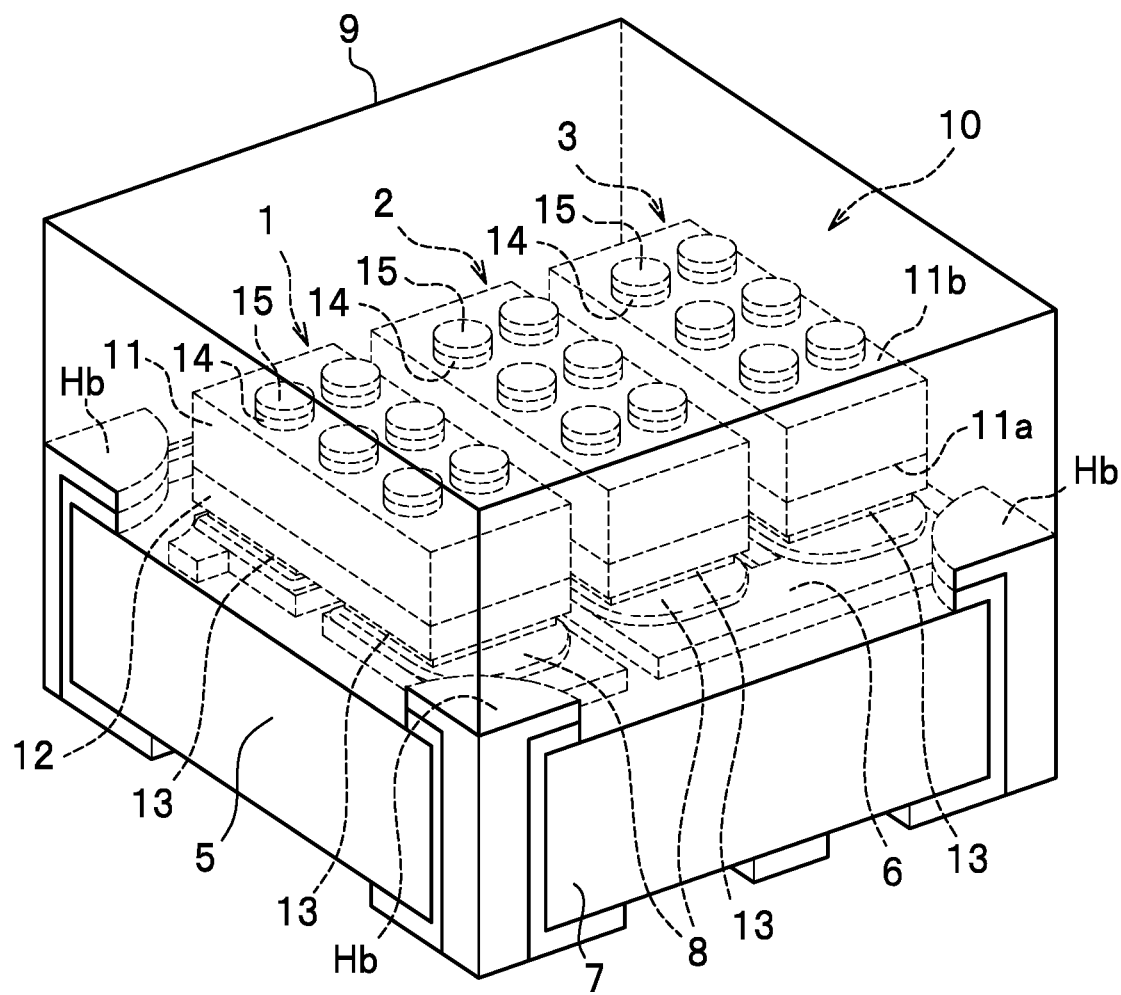
FIG. 8 is a schematic perspective view of a modification of the light-emitting device according to any of the above embodiments.

The light-emitting devices 10 (i.e., 10A to 10G) described above may further include an encapsulating member 9 as shown in FIG. 8. The encapsulating member 9 is preferably formed using a light-transmissive material having good resistance to environment, light, and heat. The term "light-transmissive" here means that the light transmittance at the emission peak wavelength of the light-emitting element is preferably 60% or more, more preferably 70% or more, even more preferably 80% or more. A silicone resin, an epoxy resin, a phenolic resin, a polycarbonate resin, an acrylic resin, or a modified resin of these resins can be used for the encapsulating member 9. The encapsulating member 9 may be formed using glass. Among these materials, silicone resins and epoxy resins, which have good resistance to water, or modified resins thereof are preferable. The encapsulating member 9 may include one of the above materials or may be constituted by layering two or more of these matrices. The encapsulating member 9 may contain a colored filler, such as a white or black filler, to eliminate the effects of extraneous light. Also, the surface of the encapsulating member 9 may have minute irregularities.

One having ordinary skill in the art will readily understand that the invention as disclosed above may be practiced with hardware elements and configurations which are different than those which are disclosed, or practiced with steps in a different order. Therefore, although the invention has been described based upon the various embodiments, it would be apparent to a person of skill in the art that certain modifications, variations, and alternative constructions would be apparent, while remaining within the spirit and scope of the invention. In order to determine the metes and bounds of the invention, therefore, reference should be made to the appended claims.

What is claimed is:
1. A light-emitting device comprising:
   a light-emitting element comprising
      a light-transmissive substrate having
         a first surface, and
         a second surface opposite to the first surface,
      a semiconductor layer on the first surface, and
      positive and negative electrodes on the semiconductor layer;
   a mounting board comprising
      wiring, and
      a base supporting the wiring,
   one or more light-reflective pieces, and
   one or more light-absorbing pieces;
   wherein the light-emitting element is flip-chip mounted on or above the wiring, and
   wherein the one or more light-reflective pieces and the one or more light-absorbing pieces partially cover the second surface and are layered in this order from the second surface, wherein the one or more light-reflective pieces are disposed between the one or more light-absorbing pieces and the second surface.

2. The light-emitting device according to claim 1, wherein a total area of the one or more light-reflective pieces and the one or more light-absorbing pieces is in a range of 10% to 60% of a total area of the second surface of the light-transmissive substrate.

3. The light-emitting device according to claim 1, wherein the light-reflective layer comprises a resin layer comprising a light-reflective substance.

4. The light-emitting device according to claim 1, wherein the light-reflective layer comprises a metal layer containing Al or Ag.

5. The light-emitting device according to claim 1, wherein the one or more light-absorbing pieces comprise a resin layer comprising a black pigment or carbon black.

6. The light-emitting device according to claim 1, wherein the one or more light-reflective pieces and the one or more light-absorbing pieces respectively have the same shapes.

7. The light-emitting device according to claim 1, wherein the one or more light-reflective pieces and the one or more light-absorbing pieces respectively have circular planar shapes.

8. The light-emitting device according to claim 1, wherein the one or more light-reflective pieces and the one or more light-absorbing pieces respectively have striped planar shapes.

9. The light-emitting device according to claim 1, the light-emitting device further comprising an encapsulating member that covers the light-emitting element.

10. The light-emitting device according to claim 9, wherein the encapsulating member comprises a silicone resin or an epoxy resin.

11. The light-emitting device according to claim 9, wherein a surface of the encapsulating member has an irregularity.

12. A light-emitting device comprising:
a plurality of light-emitting elements, each of the light-emitting elements comprising
a light-transmissive substrate having
a first surface, and
a second surface opposite to the first surface,
a semiconductor layer on the first surface, and
positive and negative electrodes on the semiconductor layer;
a mounting board, comprising
wiring, and
a base supporting the wiring;
one or more light-reflective pieces; and
one or more light-absorbing pieces,
wherein the light-emitting elements are flip-chip mounted on or above the wiring,
wherein the light-emitting elements comprise
a first light-emitting element emitting light with a first wavelength,
a second light-emitting element emitting light with a second wavelength different from the first wavelength, and
a third light-emitting element emitting light with a third wavelength different from the first wavelength and the second wavelength, and
wherein the one or more light-reflective pieces and the one or more light-absorbing pieces cover part of at least one of the second surfaces and are layered in this order from the second surface.

13. The light-emitting device according to claim 12, wherein:
the first light-emitting element comprises an element emitting red light,
the second light-emitting element comprises an element emitting green light, and
the third light-emitting element comprises an element emitting blue light.

14. The light-emitting device according to claim 12, wherein the light-transmissive substrate of the first light-emitting element is free from the one or more light-reflective pieces and the one or more light-absorbing pieces on or above the light-transmissive substrate of the first light-emitting element.

15. The light-emitting device according to claim 12, wherein planar shapes of the one or more light-reflective pieces and the one or more light-absorbing pieces differ between the first light-emitting element, the second light-emitting element, and the third light-emitting element.

16. A light-emitting device comprising:
a light-emitting element comprising
a light-transmissive substrate having
a first surface, and
a second surface opposite to the first surface,
a semiconductor layer on the first surface, and
positive and negative electrodes on the semiconductor layer;
a mounting board comprising
wiring, and
a base supporting the wiring,
one or more light-reflective pieces, and
one or more light-absorbing pieces;
wherein the light-emitting element is flip-chip mounted on or above the wiring,
wherein the one or more light-reflective pieces and the one or more light-absorbing pieces cover part of the second surface and are layered in this order from the second surface, and
wherein a total area of the one or more light-reflective pieces and the one or more light-absorbing pieces is in a range of 10% to 60% of a total area of the second surface of the light-transmissive substrate.

17. A light-emitting device comprising:
a light-emitting element comprising
a light-transmissive substrate having
a first surface, and
a second surface opposite to the first surface,
a semiconductor layer on the first surface, and
positive and negative electrodes on the semiconductor layer;
a mounting board comprising
wiring, and
a base supporting the wiring,
one or more light-reflective pieces, and
one or more light-absorbing pieces;
wherein the light-emitting element is flip-chip mounted on or above the wiring,
wherein the one or more light-reflective pieces and the one or more light-absorbing pieces cover part of the second surface and are layered in this order from the second surface, and
wherein the one or more light-absorbing pieces comprise a resin layer comprising a black pigment or carbon black.

18. A light-emitting device comprising:
a light-emitting element comprising
a light-transmissive substrate having
a first surface, and
a second surface opposite to the first surface,
a semiconductor layer on the first surface, and
positive and negative electrodes on the semiconductor layer;
a mounting board comprising
wiring, and
a base supporting the wiring,
one or more light-reflective pieces, and
one or more light-absorbing pieces;
wherein the light-emitting element is flip-chip mounted on or above the wiring,
wherein the one or more light-reflective pieces and the one or more light-absorbing pieces cover part of the second surface and are layered in this order from the second surface, and
wherein the one or more light-reflective pieces and the one or more light-absorbing pieces respectively have the same shapes.

19. A light-emitting device comprising:
a light-emitting element comprising
a light-transmissive substrate having
a first surface, and
a second surface opposite to the first surface,
a semiconductor layer on the first surface, and
positive and negative electrodes on the semiconductor layer;
a mounting board comprising
wiring, and
a base supporting the wiring,
one or more light-reflective pieces, and
one or more light-absorbing pieces;
wherein the light-emitting element is flip-chip mounted on or above the wiring,
wherein the one or more light-reflective pieces and the one or more light-absorbing pieces cover part of the second surface and are layered in this order from the second surface, and wherein the one or more light-reflective pieces and the one or more light-absorbing pieces respectively have circular planar shapes.

\* \* \* \* \*